United States Patent
Fan et al.

(10) Patent No.: US 7,019,292 B1
(45) Date of Patent: Mar. 28, 2006

(54) E-BEAM DETECTION OF DEFECTIVE CONTACTS/VIAS WITH FLOODING AND ENERGY FILTER

(75) Inventors: Frank Y. H. Fan, Pleasanton, CA (US); David L. Adler, San Jose, CA (US); Kirk J. Bertsche, San Jose, CA (US); Luca Grella, Gilroy, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 0 days.

(21) Appl. No.: 10/869,588

(22) Filed: Jun. 15, 2004

(51) Int. Cl.
 *H01J 37/256* (2006.01)
(52) U.S. Cl. ............ 250/305; 250/310; 250/306; 250/307; 250/397; 250/492.2; 250/252.1
(58) Field of Classification Search ............... 250/305, 250/310, 306, 307, 397, 492.2
See application file for complete search history.

(56) References Cited

U.S. PATENT DOCUMENTS

| | | |
|---|---|---|
| 5,493,116 A | 2/1996 | Toro-Lira et al. |
| 5,578,821 A | 11/1996 | Meisberger et al. |
| 5,973,323 A | 10/1999 | Adler et al. |
| 6,038,018 A | 3/2000 | Yamazaki et al. |
| 6,232,787 B1 * | 5/2001 | Lo et al. ............... 324/751 |
| 6,317,514 B1 | 11/2001 | Reinhorn et al. |
| 6,426,501 B1 * | 7/2002 | Nakagawa ............. 250/310 |
| 6,583,414 B1 | 6/2003 | Nozoe et al. |
| 6,646,262 B1 * | 11/2003 | Todokoro et al. ....... 250/310 |

FOREIGN PATENT DOCUMENTS

WO   WO 96/08835   3/1996

OTHER PUBLICATIONS

A. Khurseed, et al "An add-on secondary electron energy spectrometer for scanning electron microscopes" Mar. 2001 Review of Scientific Instruments, pp. 1708-1714, vol. 72, No. 3.

* cited by examiner

*Primary Examiner*—Nikita Wells
*Assistant Examiner*—Zir R. Hashmi
(74) *Attorney, Agent, or Firm*—Okamoto & Benedicto LLP

(57) ABSTRACT

One embodiment disclosed relates to a method for robustly detecting a defective high aspect ratio (HAR) feature. A surface area of a semiconductor specimen with HAR features thereon is charged up, and a primary beam is impinged onto the surface area. Scattered electrons that are generated due to the impingement of the primary beam are extracted from the surface area. An energy filter is applied to remove the scattered electrons with lower energies, and the filtered electrons are detected. Image data is generated from the detected electrons, and an intensity threshold is applied to the image data.

22 Claims, 6 Drawing Sheets

Surface charged positively by flooding

Defective Via 304
Normal Via 302

Surface charged negatively by flooding 402
Dielectric (Oxide, etc.) 204
Defective Contact/Via 208
Remaining oxide due to under-etch or contamination 210
Si Substrate 202
Normal Contact/Via 206
The bottom is grounded 404
The bottom is floating and charged more negatively than the surface, providing an energy boost for secondary electrons emitted here 406

(a) With Energy Filter (b) Without Energy Filter (a) Without Energy Filter (And No Intensity Threshold)

(b) Without Energy Filter And With Intensity Threshold (a) With Energy Filter (And No Intensity Threshold)

(b) With Energy Filter And With Intensity Threshold

E-BEAM DETECTION OF DEFECTIVE CONTACTS/VIAS WITH FLOODING AND ENERGY FILTER

BACKGROUND OF THE INVENTION

1. Field of the Invention

The present invention relates generally to specimen inspection and review. More particularly, the present invention relates to e-beam inspection and review systems.

2. Description of the Background Art

Automated inspection and review systems are important in process control and yield management for the semiconductor and related microelectronics industries. Such systems include optical and electron beam (e-beam) based systems.

In the manufacture of semiconductor devices, detection of physical defects and electrical failure earlier in the fabrication process is becoming increasingly important to shorten product development cycles and increase product yield and productivity. Advanced wafer inspection systems based on scanning electron microscopy technology have been used to detect defects and electrical failure as voltage contrast defects. However, as device design rules further shrink, and new processes (such as, for example, high aspect ratio (HAR) contacts in front-end-of-line (FEOL), HAR vias in back-end-of-line (BEOL), and dual damascene copper processes) are being widely implemented, it becomes more challenging to detect defects in device structures with smaller design rules and higher aspect ratios. Further, image contrast variation caused by uneven charge distribution can make e-beam inspection unstable or un-inspectable. Such contrast variation can occur from inside a die, from die to die, row to row, or wafer to wafer. In order to successfully inspect a wafer, control of surface charge is advantageous to 1) detect voltage contrast defects effectively, and 2) reduce image contrast variation during inspection.

In a conventional scanning electron microscope, a beam of electrons is scanned over a sample (e.g., a semiconductor wafer). Multiple raster scans are typically performed over an area of the sample. The beam of electrons either interact with the sample and cause an emission of secondary electrons or bounce off the sample as backscattered electrons. The secondary electrons and/or backscattered electrons are then detected by a detector that is coupled with a computer system. The computer system generates an image that is stored and/or displayed on the computer system.

Semiconductors have various features, some of which have high aspect ratios. High aspect ratio features are features with height substantially greater than width. For example, if a feature is 0.20 microns wide and 0.40 microns deep, then it would have an aspect ratio of two. As another example, if a feature is 0.1 microns wide and 0.5 microns deep, then it would have an aspect ratio of five. Typically, the higher the aspect ratio of the feature, the more difficult it is to characterize using existing tools.

SUMMARY

One embodiment of the invention pertains to a method for robustly detecting a defective high aspect ratio (HAR) feature. A surface area of a semiconductor specimen with HAR features thereon is charged up, and a primary beam is impinged onto the surface area. Scattered electrons that are generated due to the impingement of the primary beam are extracted from the surface area. An energy filter is applied to remove the scattered electrons with lower energies, and the filtered electrons are detected. Image data is generated from the detected electrons, and an intensity threshold is applied to the image data.

DETAILED DESCRIPTION

Figure 1:
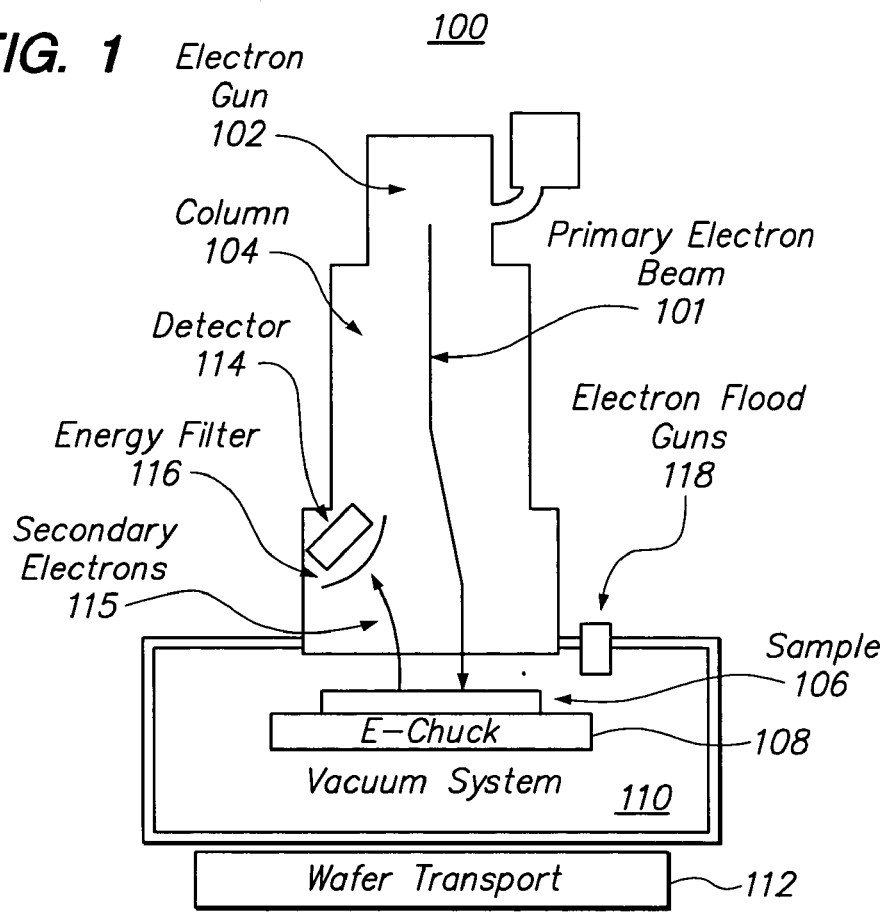
FIG. 1 is a schematic diagram of an electron beam system in accordance with an embodiment of the invention.

FIG. 1 is a schematic diagram of an electron beam system 100 in accordance with an embodiment of the invention. The e-beam system 100 generates and directs an incident electron beam 101 towards an area of interest on a sample or specimen 106 for use in generating an image of the area.

As shown in FIG. 1, the incident beam 101 may be generated by an electron gun 102. A column 104 including various components in a vacuum is used to direct the electron beam 101 towards the surface of the sample 106. The column 104 typically includes various electron lenses, apertures, and other components.

The sample 106 may be held on a stage 108. The stage 106 may be biased at a controllable electrical potential. Like the column 104, because the incident beam comprises electrons, a vacuum system 110 is used to pump the chamber containing the sample 106 and stage 108 (as well as the column 104). The sample 106 may comprise, for example, a wafer or other substrate. A wafer transport system 112 may be used to move wafer samples to be inspected in-line as part of a manufacturing process.

The e-beam system 100 also includes a detector 114 to detect secondary electrons 115 emitted from the sample. The e-beam system 100 may also include an image generator (not shown) for forming an image from the detected emitted particles.

In accordance with an embodiment of the invention, the e-beam system 100 advantageously includes both an energy filter 116 and an electron flood gun (or guns) 118. As described further below, the flood gun(s) 118 may be advantageously utilized to charge the surface of the sample, and the energy filter 116 may be advantageously applied to highlight the signal from the bottom of high aspect ratio (HAR) features, such as contacts and vias. In one embodiment, the energy filter is applied using a negatively-biased electrostatic grid in front of a detector. In another embodiment, the energy filter is applied using an omega filter in front of a detector. In another embodiment, the energy filter is applied using a Wien filter in front of a detector. In another embodiment, the energy filter is applied using an electrostatic or magnetic deflector in front of a detector.

Figure 2:
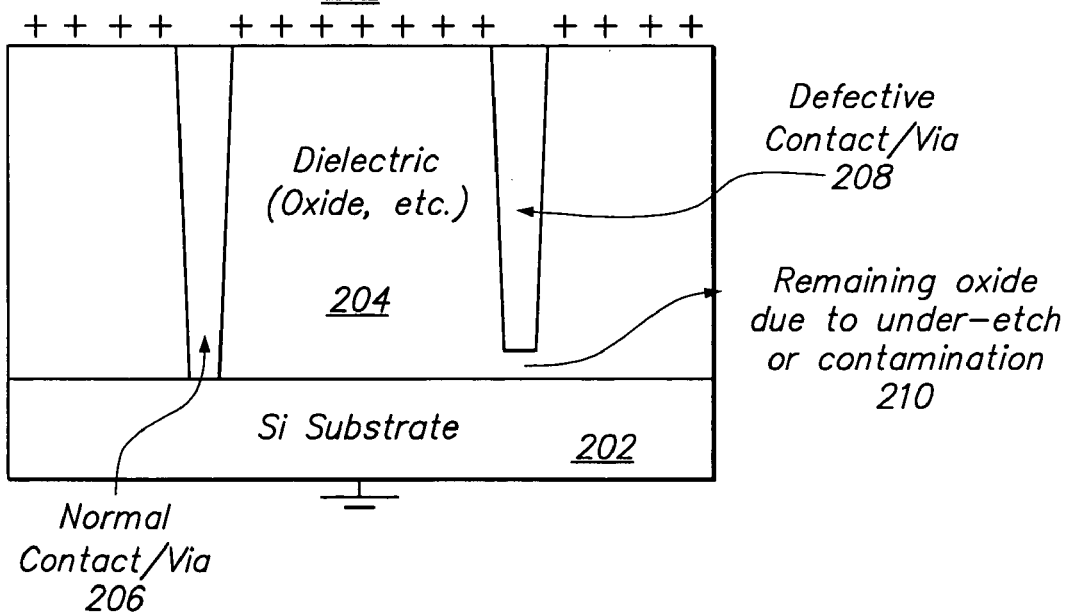
FIG. 2 is a cross-sectional diagram depicting normal and defective contacts with a positively charged surface in accordance with an embodiment of the invention.

FIG. 2 is a cross-sectional diagram depicting a silicon substrate 202 having a dielectric layer 204 thereon. The dielectric layer 204 includes example normal 206 and defective 208 contact or via features. The normal contact/via 206 is completely etched to the silicon substrate 202. The defective contact/via 208 is defective because there remains oxide (or other contamination) 210 due to under-etch (or contamination) such that the contact/via does not reach the silicon substrate 202. The surface 212 is charged positively by appropriate configuration of the electron flooding system.

In this case, since the silicon substrate 202 is electrically grounded, the bottom of the normal contact/via 206 is grounded, and the bottom of the defective contact/via 208 is floating (i.e. not grounded). As a result, secondary electrons emitted from the bottom of the normal contact/via 206 receive an energy boost compared to secondary electrons emitted from the positively-charged surface 212. The energy boost is due to acceleration as the electrons travel up the normal contact/via 206 to the positively charged surface 212. On the other hand, secondary electrons emitted from the bottom of the defective contact/via 208 do not receive a significant energy boost because there is no significant charge differential between the floating bottom of the contact/via 208 and the surface 212.

In accordance with an embodiment of the invention, a high-pass threshold energy filter may be advantageously applied to the secondary electron s. Because the secondary electrons emitted from the bottom of the normal contacts 206 receive the energy boost, the normal contacts 206 will appear significantly brighter in the filtered image due to significantly more of the energy-boosted electrons passing the filter. On the other hand, because the secondary electrons emitted from the bottom of the defective contacts 208 do not receive the energy boost, the defective contacts 208 will appear darker in the filtered image due to fewer electrons passing the filter.

Figure 3:
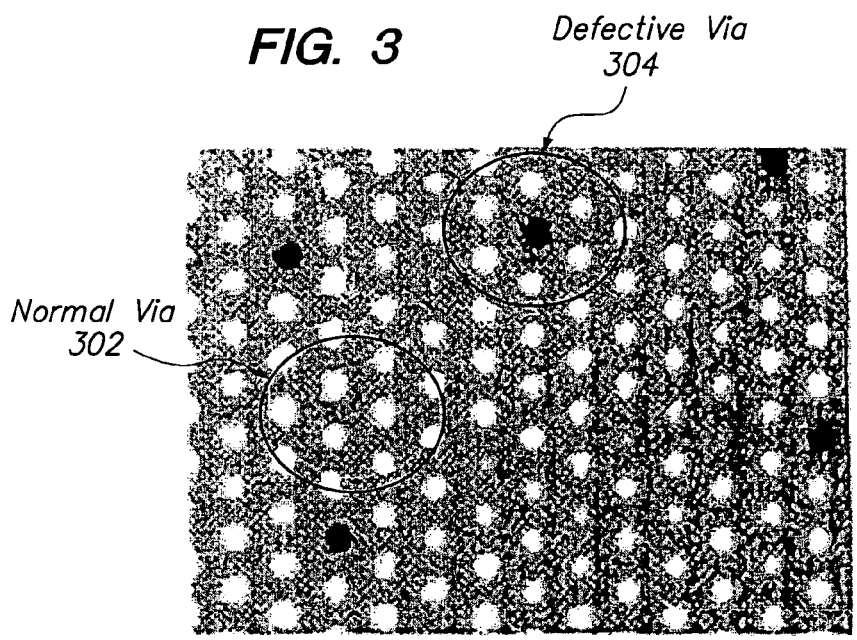
FIG. 3 shows an example filtered image acquired from a sample with a positively charged surface in accordance with an embodiment of the invention.

FIG. 3 shows an example filtered image acquired from a sample with a positively charged surface in accordance with an embodiment of the invention. As discussed above, the normal contacts or vias 302 are shown as bright spots in the filtered image. (For example, see the bright spots within the circle marked "Normal Via".) Meanwhile, the defective contacts or vias 304 are shown as dark spots in the filtered image. (For example, see the dark spot in the middle of the circle marked "Defective Via".)

Figure 4:
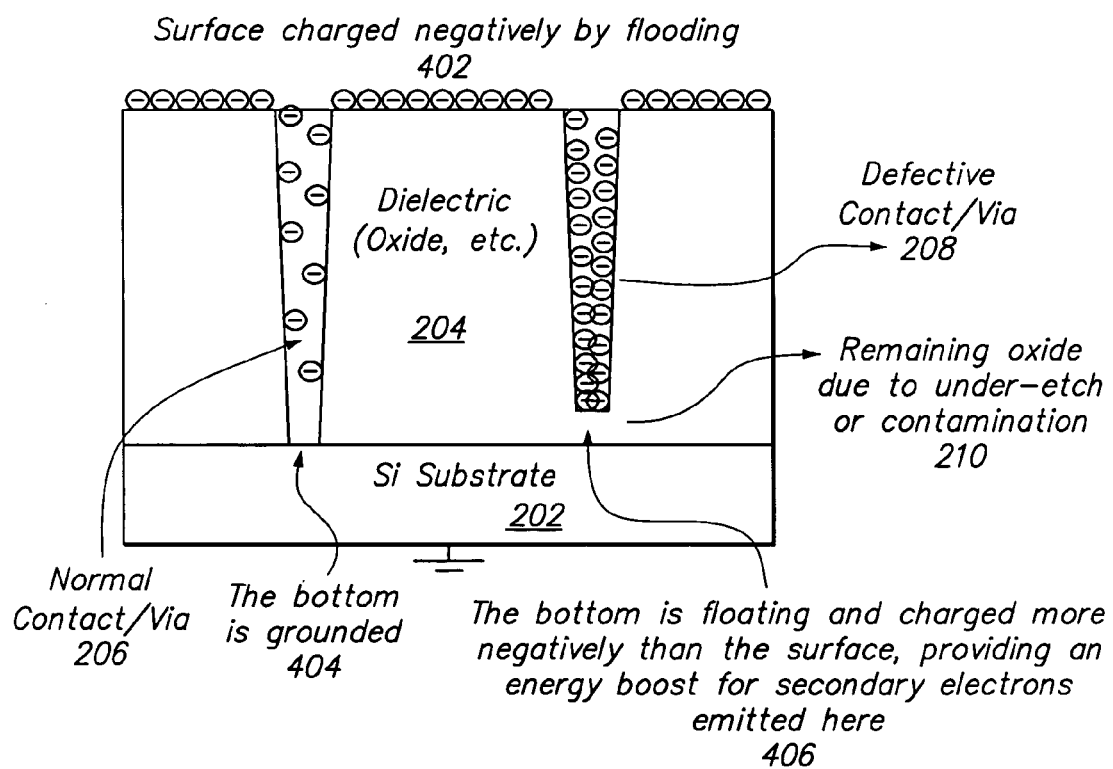
FIG. 4 is a cross-sectional diagram depicting normal and defective contacts with a negatively charged surface in accordance with an embodiment of the invention.

FIG. 4 is a cross-sectional diagram depicting normal 206 and defective 208 contacts with a negatively charged surface 402 in accordance with an embodiment of the invention. Again, the normal contact 206 has an electrically grounded bottom 404, while the defective contact 208 has an electrically floating bottom 406. In this case, the bottom 406 of the defective contact 208 becomes charged more negatively than the surface 402. Applicants believe that this is due to the cumulative effect of the electrons at the bottom of and inside the defective contact/via 208. Meanwhile, the bottom of the normal contact 206 is neutral due to being grounded (i.e. more positively with respect to the surface charge level).

In accordance with an embodiment of the invention, a high-pass threshold energy filter may be advantageously applied to the secondary electrons. Because the secondary electrons emitted from the bottom 406 of the defective contacts 208 receive the energy boost due to the less negatively charged surface 402, the defective contacts 208 will appear significantly brighter due to significantly more of the energy-boosted electrons passing the filter. On the other hand, because the secondary electrons emitted from the bottom 404 of the normal contacts 206 feel a retarding force from the more negatively charged surface 402, the normal contacts 206 will appear darker due to the limited number of secondary electrons emitted at the bottom that can escape and reach the detector.

Figure 5:
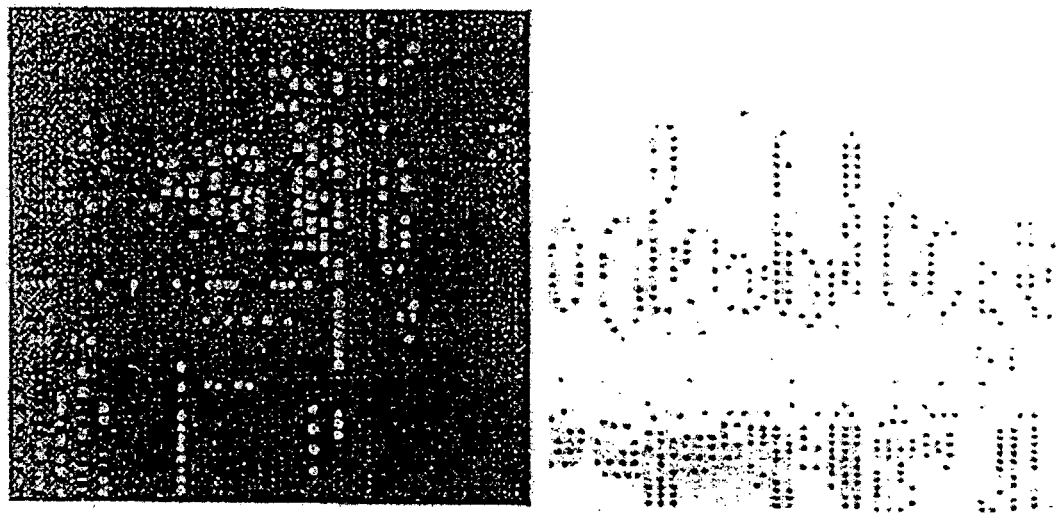
FIG. 5 shows images acquired from a sample with a negatively charged surface a) with and b) without energy filtering in accordance with an embodiment of the invention.

FIG. 5 shows images acquired from a sample with a negatively charged surface (a) with and (b) without energy filtering in accordance with an embodiment of the invention.

In the unfiltered image of FIG. 5(b), the dark spots correspond to normal contacts, and there is relatively little contrast between the defective contacts and the background. For example, the contrast between the defects and the background in FIG. 5(b) is only about 10 gray levels.

On the other hand, in the filtered image of FIG. 5(a), the bright spots correspond to defective contacts. The filtering advantageously highlights the defective contacts in FIG. 5(a) by enhancing the contrast between the defective contacts and both the background and normal contacts. For example, the contrast between the defects and the background in FIG. 5(a) is about 80 gray levels. As discussed below, the greater contrast in the filtered image with respect to the defective contacts/vias allows for a new and more efficiently implementable algorithm for defect detection.

A conventional algorithm for defect detection involves cell-to-cell or die-to-die comparison. For example, the image from the sample being inspected or reviewed may be compared against an image from a known defect-free sample. This conventional technique requires image alignment so as to make the image comparison. A "double detection" or "double arbitration" algorithm may be used to increase the robustness of the defect detection (i.e. to decrease false detection).

Figure 6:
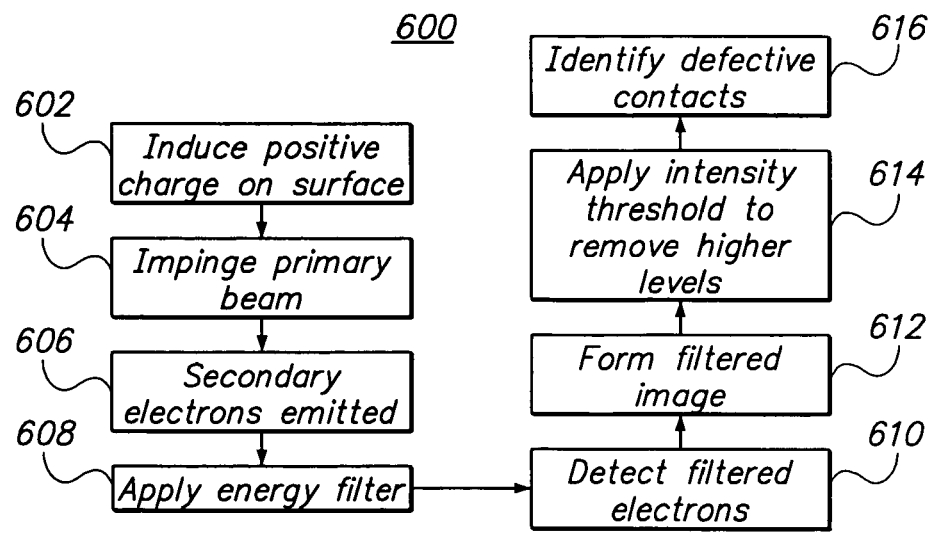
FIG. 6 is a flow chart depicting a first method of detection of defective contacts and/or vias in accordance with an embodiment of the invention.

In accordance with an embodiment of the invention, a first method 600 of detection of defective contact and/or vias is shown in the flow chart of FIG. 6. The method 600 involves the following steps. A positive charge is induced 602 onto the surface of the sample being inspected or reviewed. In one implementation, the positive charge is induced using one or more flood guns. A primary electron beam is impinged 604 onto the positively-charged area with the contacts/vias being inspected. Secondary electrons are emitted 606 from the illuminated surface. However, an energy filter is applied so as to substantially reduce or eliminate 608 secondary electrons with energies below an energy threshold. In other words, only secondary electrons with energies above the energy threshold are detected 610. A filtered image may be formed 612 from the detected secondary electrons. The filtered image data shows defective contacts as dark spots (for example, as shown in FIG. 3). Next, an intensity (or gray level) threshold is applied 614, such that intensities (or gray levels) above the threshold are eliminated from consideration as defects. Appropriate features with intensity levels below the threshold (i.e. not eliminated by the intensity threshold) are identified 616 as defective contacts.

Figure 7:
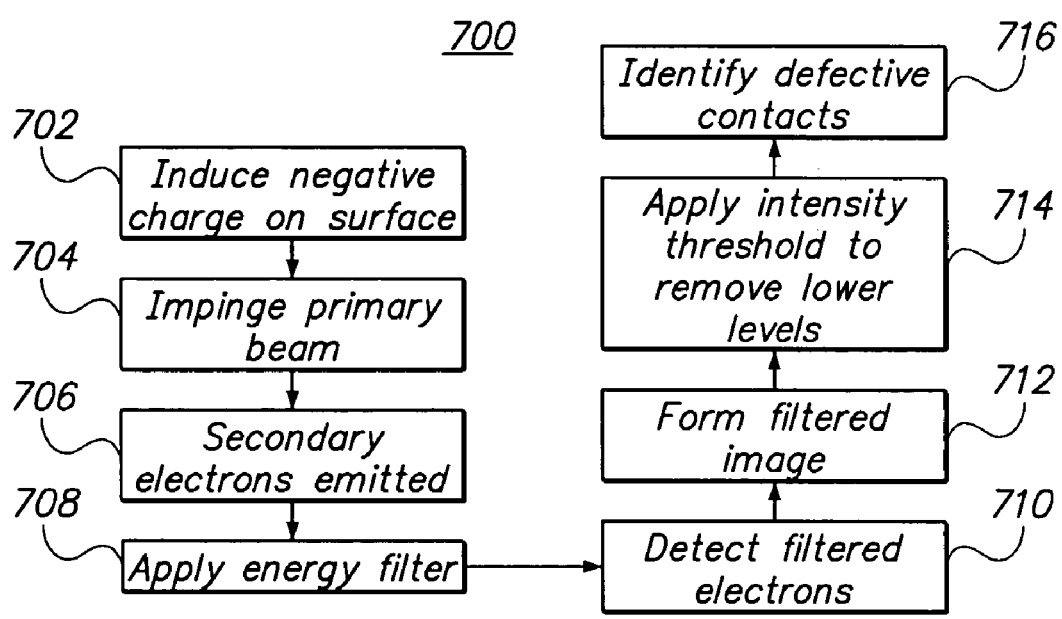
FIG. 7 is a flow chart depicting a second method of detection of defective contacts and/or vias in accordance with an embodiment of the invention.

In accordance with another embodiment of the invention, a second method 700 of detection of defective contact and/or vias is shown in the flow chart of FIG. 7. The method 700 involves the following steps. A negative charge is induced 702 onto the surface of the sample being inspected or reviewed. In one implementation, the negative charge is induced using one or more flood guns. A primary electron beam is impinged 704 onto the negatively-charged area with the contacts/vias being inspected. Secondary electrons are emitted 706 from the illuminated surface. However, an energy filter is applied so as to substantially reduce or eliminate 708 secondary electrons with energies below an energy threshold. In other words, only secondary electrons with energies above the energy threshold are detected 710. A filtered image may be formed 712 from the detected secondary electrons. The filtered image data shows defective contacts as bright spots (for example, as shown in FIG. 5(a)). Next, an intensity (or gray level) threshold is applied 714, such that intensities (or gray levels) below the threshold are eliminated from consideration as defects. Appropriate features with intensity levels above the threshold (i.e. not eliminated by the intensity threshold) are identified 716 as defective contacts.

Figure 8:
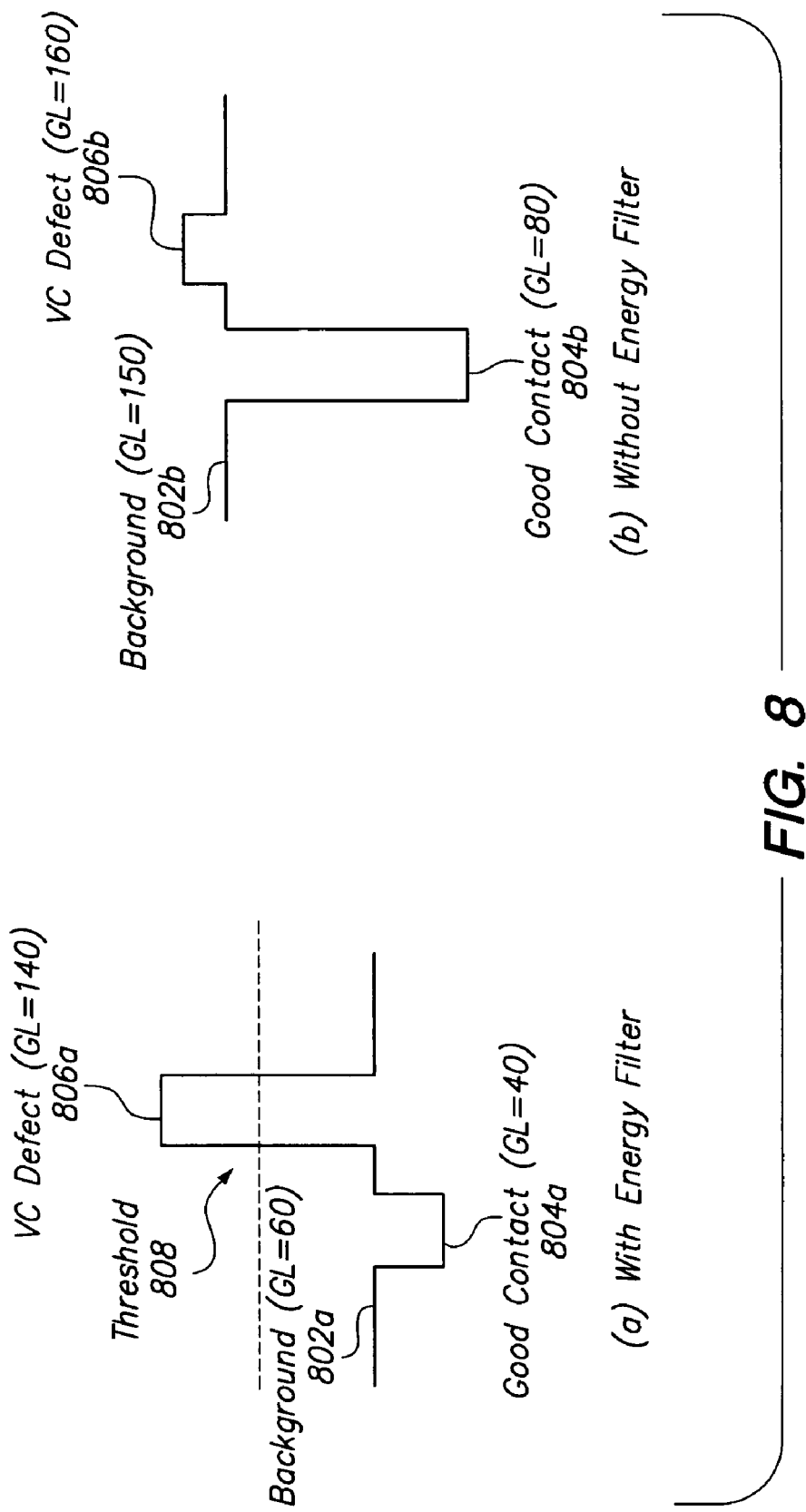
FIG. 8 provides schematic diagrams for further discussion of the intensity-threshold technique.

FIG. 8 provides schematic diagrams for further discussion of the intensity-threshold technique. In FIG. 8, the height of the signal indicates the intensity of secondary electrons detected from specific areas, including the background surface 802, a good (normal) contact 804, and a defective contact 806.

FIG. 8(a) is representative of detected intensities from filtered image data such as that shown in FIG. 5(a). In this example, the background surface intensity level 802a is depicted at a gray level (GL) of 60. Here, the good (normal) contact intensity level 804a is slightly lower than the background and is depicted at a gray level of 40, while the defective contact intensity level 806a is substantially higher than the background and is depicted at a gray level of 140. In this case, an intensity threshold (for example, at gray level of 100) effectively identifies the defective contacts. This effective defect detection is accomplished because the post-filtering contrast between the defective contacts and the background (and good contacts) is sufficiently large for the intensity threshold level to robustly isolate the defects.

On the other hand, FIG. 8(b) is representative of detected intensities from unfiltered image data such as that shown in FIG. 5(b). In this example, the background surface intensity level 802b is depicted at a higher gray level (GL) of 150. The good (normal) contact intensity level 804b is much lower than the background and is depicted at a gray level of 80, while the defective contact intensity level 806b is slightly higher than the background and is depicted at a gray level of 160. In this case, an intensity threshold (for example, at gray level of 155) cannot robustly identify the defective contacts. This is because the unfiltered contrast between the defective contacts and the background is too small for such detection to be robust. In other words, one would expect undesirable false defect detection.

Figure 9:
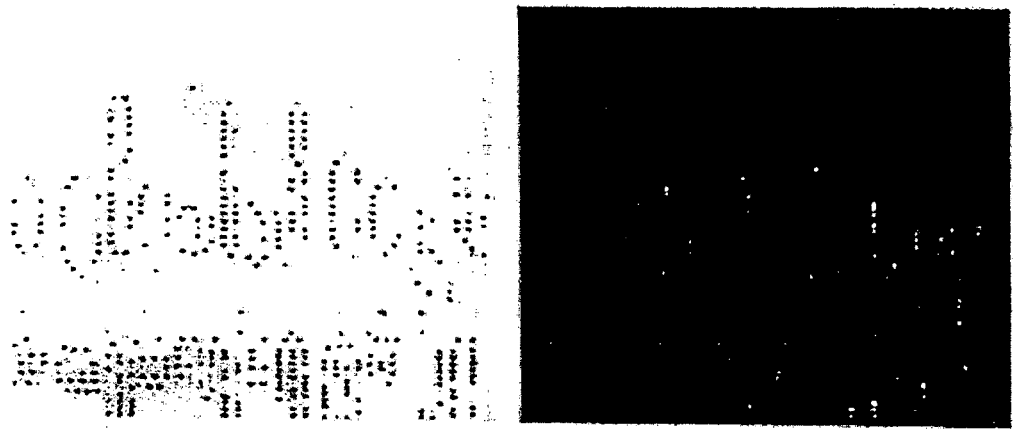
FIG. 9 shows images acquired from samples without energy filtering and both (a) without or (b) with the intensity threshold applied.

FIG. 9 shows images acquired from samples without energy filtering and both (a) without or (b) with the intensity threshold being applied. As seen from FIG. 9(b), the defects are not readily and robustly identifiable after the intensity threshold (at gray level 155) is applied to the unfiltered data.

Figure 10:
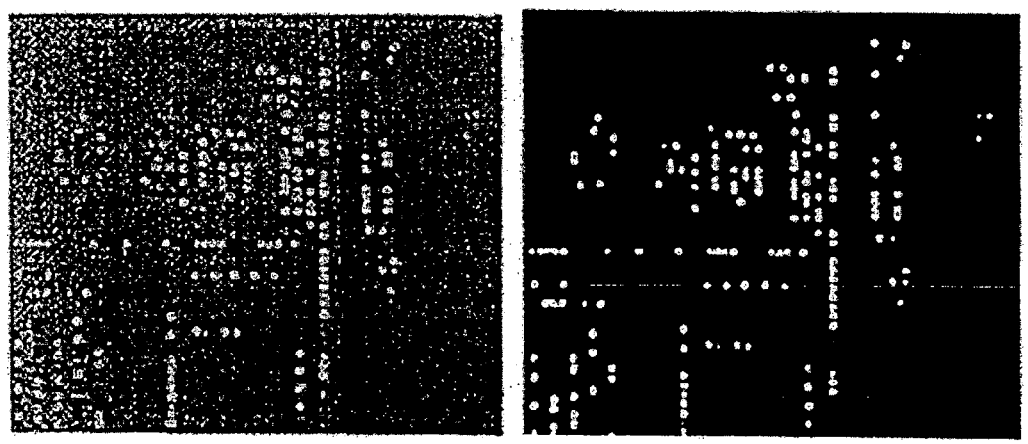
FIG. 10 shows images acquired from samples with energy filtering and both (a) without or (b) with the intensity threshold applied.

In contrast, FIG. 10 shows images acquired from samples with energy filtering and both (a) without or (b) with the intensity threshold being applied. Here, as seen from FIG. 10(b), the defects are distinctly and robustly identifiable after the intensity threshold (at gray level 80) is applied to the filtered data. As shown in FIG. 10(b), the signal from the defective contacts is boosted and the surrounding noise is reduced.

Advantageously, the above-disclosed technique uses both energy filtering and intensity thresholding, in combination, to achieve a straightforward and robust way to detect defective contacts and/or vias. One embodiment involves charging the surface positively and applying the intensity threshold to eliminate higher intensity image data. Another embodiment involves charging the surface negatively and applying the intensity threshold to eliminate lower intensity image data. This invented technique advantageously avoids the need for image alignment and other disadvantageous aspects of the conventional algorithm that performs cell-to-cell or die-to-die comparison.

The above discussion describes the use of a high-pass energy filter. In an alternate embodiment, a low-pass energy filter could be used instead, resulting in an inversion of the "bright" and "dark" areas in the above description.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A method for robustly detecting a defective high aspect ratio (HAR) feature, the method comprising:
    charging a surface area of a semiconductor specimen with HAR features thereon;
    impinging a primary beam onto the surface area;
    extracting from the surface area scattered electrons that are generated due to the impingement of the primary beam;
    applying an energy filter to remove the scattered electrons with lower or higher energies;
    detecting the filtered electrons;
    generating image data from the detected electrons; and
    applying an intensity threshold to the image data, wherein the intensity threshold is applied to remove image data with intensity levels above the intensity threshold if said charging induces a positive charge onto the surface area, and wherein the intensity threshold is applied to remove image data with intensity levels below the intensity threshold if said charging induces a negative charge onto the surface area.

2. The method of claim 1, wherein the surface area is charged positively.

3. The method of claim 2, wherein the charging is performed using at least one electron flood gun.

4. The method of claim 1, wherein the surface area is charged negatively.

5. The method of claim 4, wherein the charging is performed using at least one electron flood gun.

6. The method of claim 1, wherein the scattered electrons comprise secondary electrons.

7. The method of claim 1, wherein the energy filter is applied using a negatively-biased electrostatic grid in front of a detector.

8. The method of claim 1, wherein the energy filter is applied using an omega filter in front of a detector.

9. The method of claim 1, wherein the energy filter is applied using a Wien filter in front of a detector.

10. The method of claim 1, wherein the energy filter is applied using an electrostatic or magnetic deflector in front of a detector.

11. The method of claim 1, wherein the feature comprises a via opening through a dielectric layer.

12. The method of claim 1, wherein the feature comprises a contact opening through a dielectric layer.

13. An electron beam apparatus, the apparatus comprising:
    means for charging a surface area of a semiconductor specimen;
    means for impinging a primary electron beam onto the surface area;
    means for extracting from the surface area scattered electrons that are generated due to the impingement of the primary electron beam onto the specimen;
    means for applying an energy filter to remove the scattered electrons with lower or higher energies;
    means for detecting the filtered electrons;
    means for generating image data from the detected electrons; and
    means for applying an intensity threshold to the image data so as to identify defective high aspect ratio features, wherein the intensity threshold is applied to remove image data with intensity levels above the intensity threshold if said charging induces a positive charge onto the surface area, and wherein the intensity threshold is applied to remove image data with intensity levels below the intensity threshold if said charging induces a negative charge onto the surface area.

14. A method for detecting defective contacts/vias through a dielectric surface layer, the method comprising:
    charging a surface area of a specimen with the contacts/vias thereon;
    impinging a primary beam onto the surface area;
    extracting from the surface area scattered electrons that are generated due to the impingement of the primary beam onto the specimen;
    applying an energy filter to remove the scattered electrons with lower energies;
    detecting the filtered electrons;
    generating image data from the detected electrons; and
    applying an intensity threshold to the image data, wherein the intensity threshold is applied to remove image data with intensity levels above the intensity threshold if said charging induces a positive charge onto the surface area, and wherein the intensity threshold is applied to remove image data with intensity levels below the intensity threshold if said charging induces a negative charge onto the surface area.

15. The method of claim 14, wherein the surface area is charged positively.

16. The method of claim 14, wherein the surface area is charged negatively.

17. The method of claim 14, wherein the charging is performed using at least one electron flood gun.

18. The method of claim 14, wherein the energy filter is applied using a negatively-biased electrostatic grid in front of a detector.

19. The method of claim 14, wherein the energy filter is applied using an omega filter in front of a detector.

20. The method of claim 14, wherein the energy filter is applied using a Wien filter in front of a detector.

21. The method of claim 14, wherein the energy filter is applied using an electric or magnetic deflector in front of a detector.

22. An apparatus for detecting defective contacts/vias through a dielectric surface layer, the apparatus comprising:
    means for charging a surface area of a specimen with the contacts/vias thereon;
    means for impinging a primary beam onto the surface area;
    means for extracting from the surface area scattered electrons that are generated due to the impingement of the primary beam;
    means for applying an energy filter to remove the scattered electrons with lower energies;
    means for detecting the filtered electrons;
    means for generating image data from the detected electrons; and
    means for applying an intensity threshold to the image data so as to identify defective high aspect ratio features, wherein the intensity threshold is applied to remove image data with intensity levels above the intensity threshold if said charging induces a positive charge onto the surface area, and wherein the intensity threshold is applied to remove image data with intensity levels below the intensity threshold if said charging induces a negative charge onto the surface area.

* * * * *